United States Patent
De Boet

(10) Patent No.: US 9,019,671 B2
(45) Date of Patent: Apr. 28, 2015

(54) ELECTRONIC DEVICE COMPRISING RF-LDMOS TRANSISTOR HAVING IMPROVED RUGGEDNESS

(71) Applicant: NXP B.V., Eindhoven (NL)

(72) Inventor: Johannes Adrianus Maria De Boet, Beuningen (NL)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 13/887,212

(22) Filed: May 3, 2013

(65) Prior Publication Data
US 2013/0307055 A1 Nov. 21, 2013

(30) Foreign Application Priority Data
May 14, 2012 (EP) .................................... 12167901

(51) Int. Cl.
*H01L 29/78* (2006.01)
*H03G 11/02* (2006.01)
*H03K 17/0814* (2006.01)

(52) U.S. Cl.
CPC ............ *H01L 29/7818* (2013.01); *H03G 11/02* (2013.01); *H03K 17/08142* (2013.01)

(58) Field of Classification Search
CPC .......... H03F 220/426; H03F 2200/444; H03G 11/02; H03K 17/08142; H01L 27/0248–27/0296
USPC ...................................... 361/56; 327/321, 318
See application file for complete search history.

(56) References Cited

U.S. PATENT DOCUMENTS

| 4,122,400 A | 10/1978 | Medendorp et al. |
| 6,794,719 B2 | 9/2004 | Petruzzello et al. |

(Continued)

FOREIGN PATENT DOCUMENTS

DE   10 2005 055832 A1   5/2007

OTHER PUBLICATIONS

SJCH Theeuwen et al., LDMOS Ruggedness Reliabilty, Microwave Journal, Apr. 2009, pp. 96-104.*
Theeuwen, S. J. C. H. et al. "LDMOS Ruggedness Reliability", Microwave Journal, vol. 5, No. 4, 5 pgs (Apr. 2009).

(Continued)

*Primary Examiner* — Tom Thomas
*Assistant Examiner* — John Bodnar

(57) ABSTRACT

The invention relates to an electronic device comprising an RF-LDMOS transistor (1) and a protection circuit (2) for the RF-LDMOS transistor. The protection circuit (2) comprises: i) an input terminal (Ni) coupled to a drain terminal (Drn) of the RF-LDMOS transistor (1); ii) a clipping node (Nc); iii) a clipping circuit (3) coupled to the clipping node (Nc) for substantially keeping the voltage on the clipping node (Nc) below a predefined reference voltage, wherein the predefined reference voltage is designed to be larger than the operation voltage on the drain terminal (Drn) and lower than a trigger voltage of a parasitic bipolar transistor (100) that is inherently present in the RF-LDMOS transistor; iv) a capacitance (Ct) coupled between the clipping node (Nc) and a further reference voltage terminal (Gnd), and v) a rectifying element (D1, D2) connected with its anode terminal to the input terminal (Ni) and with its cathode terminal to the clipping node (Nc). The invention provides an RF-LDMOS transistor having an improved RF ruggedness, while not, or at least to a much lesser extent, compromising the RF performance of the RF-LDMOS transistor.

14 Claims, 6 Drawing Sheets

(56) References Cited

U.S. PATENT DOCUMENTS

| | | | |
|---|---|---|---|
| 7,787,227 B1* | 8/2010 | Terrovits | 361/56 |
| 2007/0249304 A1* | 10/2007 | Snelgrove et al. | 455/127.2 |
| 2011/0309872 A1 | 12/2011 | Blair et al. | |
| 2013/0217345 A1* | 8/2013 | Balteanu et al. | 455/84 |

OTHER PUBLICATIONS

"Circulator" Wikipedia, 3 pgs retrieved from the internet at: http://en.wikipedia.org/wiki/Circulator (May 1, 2013).

Extended European Search Report for Patent Appln. No. 12167901.3 (Aug. 2, 2012).

* cited by examiner

ELECTRONIC DEVICE COMPRISING RF-LDMOS TRANSISTOR HAVING IMPROVED RUGGEDNESS

CROSS-REFERENCE TO RELATED APPLICATIONS

This application claims the priority under 35 U.S.C. §119 of European patent application no. 12167901.3, filed on May 14, 2012, the contents of which are incorporated by reference herein.

FIELD OF THE INVENTION

The invention relates to an electronic device comprising an RF-LDMOS transistor and a protection circuit for the RF-LDMOS transistor.

BACKGROUND ART

In base stations for personal communication systems (GSM, EDGE, W-CDMA), RF-power amplifiers (PA) are key components. For these power amplifiers, RF Laterally Diffused MOS (LDMOS) transistors are the standard choice of technology, because of their excellent power capabilities gain, linearity and reliability.

An RF power amplifier is a type of electronic amplifier used to convert a low-power radio-frequency signal into a larger signal of significant power, typically for driving the antenna of a transmitter. It is usually optimized to have high efficiency, high output Power (P1dB) compression, good return loss on the input and output, good gain, and optimum heat dissipation. The basic applications of the RF power amplifier include driving another high power source, driving a transmitting antenna, microwave heating, and exciting resonant cavity structures. Among these applications, driving transmitter antennas is most well-known. The transmitter-receivers are used not only for voice and data communication but also for weather sensing (in the form of radar).

An RF power amplifier generally comprises of a package having a source lead (plate shaped), a drain lead, and a gate lead. Inside the package there is provided a semiconductor die in which the RF power transistor is manufactured. Depending on the size of the semiconductor die, there may also be a capacitor (MOSCAP) provided at the gate side of the die and there may be a further capacitor at the drain side. The capacitor(s) are added for impedance matching of the semiconductor die to the outside world. The die is wire bonded to the respective leads. For (electrical) performance reasons, the bond wires are kept as short as possible. Power amplifiers (PA's) for base stations use predominantly laterally-diffused metal-oxide-semiconductor (LDMOS) technology. The trend in base station PA's is towards higher peak power capabilities to be able to transmit more channels for larger data capacity. Modern LDMOS dies are designed in such a way that the gate and drain contacts are at the topside of the die and the source contact is on the backside of the die. The LDMOS packages are designed to fit this configuration. The gate and drain can be connected to the leads through bond wires. The source is connected to the bottom (lead) of the package (flange) using the backside contact of the die. The flange acts as a third lead. This configuration ensures a very short connection between the die and the third lead (source). This back-side contacting of the source is only possible in case the substrate of the die is conducting, which is the case in silicon-based LDMOS technology.

Another important performance indicator for power RF-LDMOS transistors is the RF-ruggedness. This RF-ruggedness may be defined as the ability to withstand reflected power at the output. Power is reflected at the output if an impedance mismatch occurs. This may occurs as an incident (e.g. at breaking of the antenna) or as a structural, normal part of the application (e.g. at switching on a lamp). The amount of reflected power a device is able to withstand is expressed in the voltage standing wave ratio (VSWR) this device is able survive (without breaking down). In many LDMOS products for base stations, a VSWR of 1:10 is specified. In an RF power amplifier the reflected power causes voltage peaks at the drain of the LDMOS in the amplifier stage. If this voltage becomes too high, the device is destroyed.

In the prior art several solutions to this problem have been proposed.

A first solution concerns the protection of a power amplifier (PA) for VSWR-mismatch by using a circulator (http://en.wikipedia.org/wiki/Circulator) at the output of the device. This is a very expensive solution.

Another solution is reported in U.S. Pat. No. 4,122,400. This published patent discloses a protection circuit for a transmitter amplifier, in which separate VSWR (reflected power) control and separate temperature control is provided when the thresholds of either or both are exceeded. When the temperature of the RF amplifier is sensed and when this temperature exceeds a certain threshold level, the output level of the RF amplifier is adjusted to protect the amplifier. Separately, there is provided a means for sensing the ration of the reflected power to the forward power (by an expensive directional couple) and when this ration exceeds a given threshold, the gain of the amplifier is cut back to thereby protect the amplifier.

A further solution is reported in U.S. Pat. No. 6,794,719B2 in which an integrated diode is proposed for ruggedness improvement of a high-voltage (HV) LDMOS transistor. However, this solution is not suitable for RF-applications. In this solution the diode must cope with a high current and high voltage (breakdown voltage of the diode), which gives large power dissipation. To avoid thermal damage a large diode must be used, which gives a large capacitance, and this gives a decrease in RF-performance.

Further ruggedness can obtained increasing the intrinsic ruggedness of the LDMOS itself. This is done by avoiding the turn-on of the bipolar NPN-transistor, which is inherently present in an LDMOS transistor. If this parasitic bipolar transistor is switching on, the device is destroyed. Avoiding turning-on of the bipolar transistor can be done by electrical field engineering, and/or lowering the base resistance of the bipolar. This is also described in publication of S. J. C. H. Theeuwen et al. al., "*LDMOS Ruggedness reliability*", Microwave Journal, Vol. 52/No. 4/April 2009/p. 96-104. However, there will always remain a trade-off between RF-performance versus intrinsic ruggedness. Furthermore, for future development of LDMOS on high resistivity substrate, it will become very hard to introduce sufficient intrinsic ruggedness into the power RF-LDMOS.

SUMMARY OF THE INVENTION

One of the objects of the invention is to provide an electronic device comprising an RF-LDMOS transistor having an improved RF ruggedness, while not, or at least to a much lesser extent, compromising the RF performance of the RF-LDMOS transistor.

The invention is defined by the independent claims, the dependent claims define embodiments.

A first aspect of the invention provides an electronic device as claimed in claim 1. The electronic device comprises an RF-LDMOS transistor and a protection circuit for the RF-LDMOS transistor. The protection circuit comprises:

- an input terminal coupled to a drain terminal of the RF-LDMOS transistor;
- a clipping node;
- a clipping circuit coupled to the clipping node for substantially keeping the voltage on the clipping node below a predefined reference voltage, wherein the predefined reference voltage is designed to be larger than the operation voltage on the drain terminal and lower than a trigger voltage of a parasitic bipolar transistor that is inherently present in the RF-LDMOS transistor;
- a capacitance coupled between the clipping node and a further reference voltage terminal, and
- a rectifying element connected with its anode terminal to the input terminal and with its cathode terminal to the clipping node.

An electronic device in accordance with the first aspect of the invention reaches several effects. First of all, the coupling of the drain terminal of the RF-LDMOS transistor to the clipping node (which is being kept below a predefined reference voltage (there are multiple ways of achieving this effect), wherein the predefined reference voltage is designed to be larger than the operation voltage on the drain terminal) via the rectifying element ensures that during normal RF operation, the voltage on the clipping node will approach (but most likely stay below) the predefined reference voltage, which means that the rectifying element is reverse biased. Thus, in normal operation, the impedance at the clipping node is not significantly loading the drain terminal of the RF-LDMOS transistor. Then, during a ruggedness event, the voltage on the drain terminal may get larger than the predefined reference voltage (which must be carefully chosen in order not to degrade the performance of the device when set too near to the operation voltage on the drain terminal). In this case the rectifying element may get forward biased and a (large) current will flow through the rectifying element (for example comprising one or more diodes) to the clipping node. This current may charge up the capacitance at the clipping node to a level higher than the predefined reference voltage. After the ruggedness event, the capacitance will de-charge to the predefined reference voltage. It is important to note that in the invention the rectifying element (for instance a diode or a series of diodes) only has to cope with large ruggedness currents in forward mode. This results in low power dissipation in the rectifying element, in particular when a diode or a series of diodes is used, because of the low voltage drop over the rectifying element (diode). A consequence of this, is that the rectifying element can be kept small in size, which is also beneficial for parasitic capacitances, which will consequently remain small as well. The latter being beneficial for the RF performance (due to a smaller degradation of RF behavior) of the electronic device.

To facilitate the understanding of the scope of the invention and its variations, a few terms are defined hereinafter.

Throughout this description the term "operation voltage" on a particular node should be considered as the voltage which that particular node has during normal operation of the device, which is typically the supply voltage added with the RF-voltage swing.

Throughout this description the term "voltage" (of a particular node) should be considered as a potential difference between the respective potential (on that particular node) and a reference potential. In principle, such reference potential may be freely chosen, but for convenience in this description the source potential of the RF-LDMOS transistor is defined as the reference potential.

Throughout this description the term "anode terminal" (of a rectifying element such as a diode) should be considered as the input terminal of the rectifying element. Furthermore, throughout this description the term "cathode terminal" should be considered as the output terminal of the rectifying element. Thus, the rectifying element is forward-biased when the anode terminal has a higher potential than the cathode terminal (and a large current may flow from anode to cathode), and the rectifying element is reverse-biased when the anode terminal has a lower potential than the cathode terminal (and a small leaking current may flow from anode to cathode).

In an embodiment the clipping circuit comprises: i) a reference voltage terminal for being coupled to the predefined reference voltage, and ii) a connector coupled between the clipping node and the reference voltage terminal. This embodiment constitutes a first main variant of forming a clipping circuit that substantially keeps the voltage on the clipping node below a predefined reference voltage. In an embodiment the connector may be formed by a respective bondwire coupled between the clipping node and the reference voltage terminal.

In an embodiment the clipping circuit comprises a further rectifying element connected with its cathode terminal to the clipping node and with its anode terminal to the further reference voltage terminal. This embodiment constitutes a second main variant of forming a clipping circuit that substantially keeps the voltage on the clipping node below a predefined reference voltage. In an embodiment the further rectifying element comprises a diode and the capacitance is formed by the parasitic capacitance of the diode.

In an embodiment the further reference voltage is the voltage of the source terminal of RF-LDMOS transistor. Even though it is not very important to what reference voltage the capacitance is coupled, it still is advantageous to select the voltage (potential) on the source terminal as the further reference voltage, because this is the only reference plane which is available in a conventional RF-LDMOS transistor. Thus, this embodiment makes the generation and routing of the further reference voltage superfluous.

In an embodiment the rectifying element comprises a single diode.

In an embodiment the rectifying comprises a plurality of diodes connected in series. This embodiment is advantageous if the break-down voltage of a single diode is below the reference voltage. The break-down voltage of a single diode manufactured in a polysilicon wire may be typically in the range from 1V to 30V. However, it is expected that break-down voltages up to 70V are possible when the process and design are optimized.

In an embodiment the further rectifying element comprises a single diode. In accordance with an aspect of the invention such diode must have a break-down voltage equal to the reference voltage.

In an embodiment the further rectifying element comprises a plurality of diodes connected in series. This embodiment is useful if the break-down voltage of a single diode is lower than the reference voltage (for example half the reference voltage).

In an embodiment the RF-LDMOS transistor and the protection circuit are integrated on a single substrate. In an advantageous embodiment this substrate is a silicon-on-insulator (SOI) substrate.

In an embodiment the RF-LDMOS transistor comprises a drain bondpad in an upper interconnect layer forming the drain terminal, wherein at least part of the clipping circuit is substantially laid out underneath the drain bondpad. The bondpad may also be a bond bar (onto which a plurality of bond wires may be bonded. Preferably, in this embodiment the respective rectifying element is manufactured in a polysilicon wire, wherein a junction has been formed by implanting n-type and p-type dopants in the respective wire. It is very convenient to implement the diodes in a poly silicon wire, as such diodes can easily be integrated underneath the drain bondpad, while having a relatively low parasitic capacitance to the substrate. In other words, the diodes could be implemented in the substrate, but this is then at the penalty of a higher capacitance to the substrate.

A second aspect of the invention provides a power amplifier comprising the electronic device according to the invention. Such power amplifier benefits from the better ruggedness of the electronic device of the invention.

A third aspect of the invention provides an integrated multi-stage power amplifier module comprising one or more electronic devices according to the invention. Such multi-stage power amplifier benefits from the better ruggedness of the electronic device of the invention.

A fourth aspect of the invention provides a cellular base station comprising the electronic device. Such cellular base station benefits from the better ruggedness of the electronic device of the invention.

BRIEF DESCRIPTION OF THE DRAWINGS

These and other aspects of the invention are apparent from and will be elucidated with reference to the embodiments described hereinafter. In the drawings.

LIST OF REFERENCE NUMERALS

Figure 1:
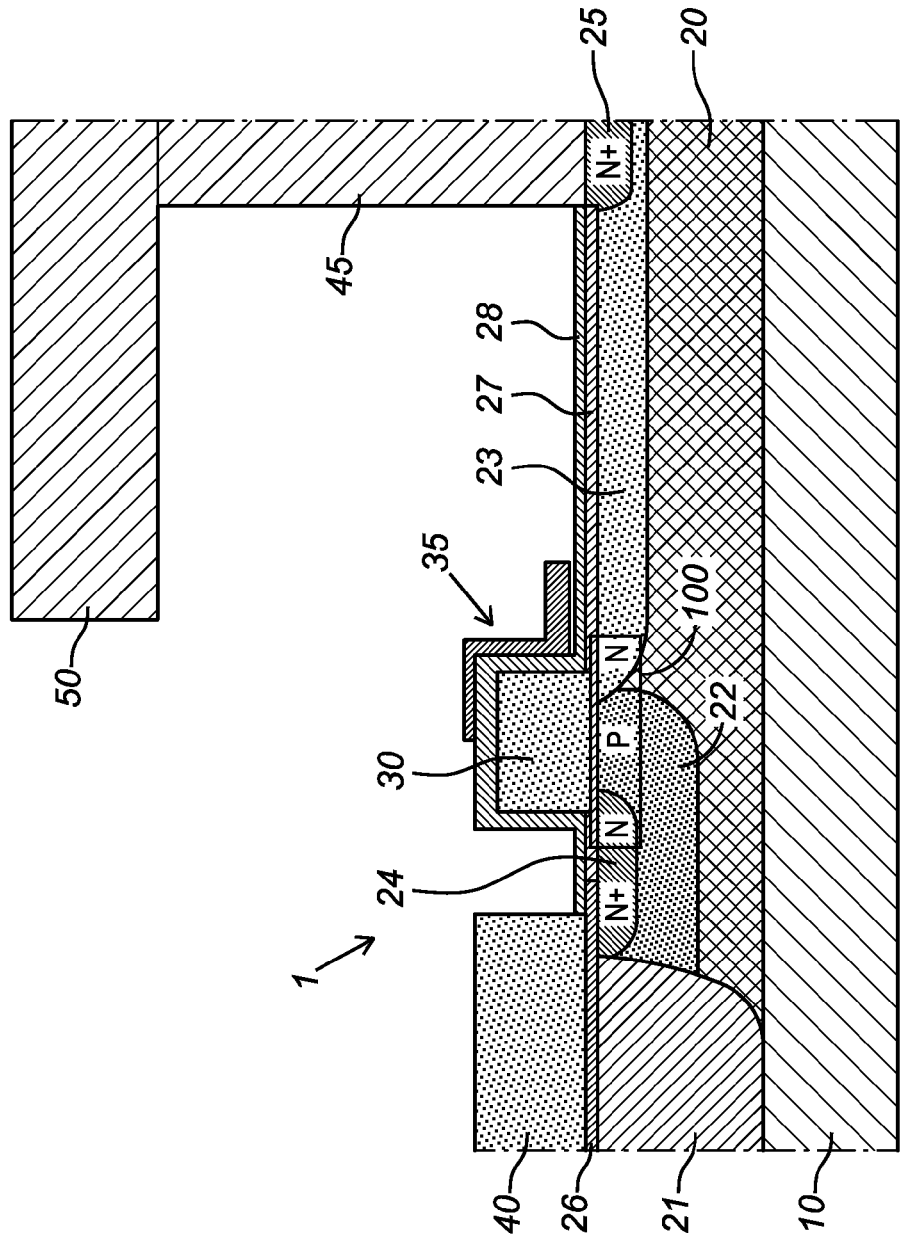
FIG. 1 shows a schematic cross-sectional view of an RF-LDMOS transistor as known from the prior art.

1 RF-LDMOS transistor
10 substrate
20 P-type EPI-layer
21 P-type sinker layer (connecting source region to substrate/source terminal)
22 P-type well region (comprising channel region of RF-LDMOS transistor)
23 N-type drain extension layer of LDMOS transistor
24 N-type source region
25 N-type drain region
26 Silicide layer (connecting P-type sinker layer 21 to N-type source region)
27 gate dielectric (dielectric layer)
28 further dielectric layer (isolating shield 35 from gate 30)
30 gate
35 shield
40 source line
45 connecting stack for drain line
50 drain line
100 parasitic bipolar transistor
2 protection circuit
3 clipping circuit
Vdd supply voltage
Gnd ground voltage
Ni input terminal of protection circuit
Nc clipping node
Drn drain terminal of LDMOS transistor
Src source terminal of LDMOS transistor
Gte gate terminal of LDMOS transistor
Ld drain terminal bondwire (inductance)
Lr reference terminal bondwire
Vref reference voltage
D1, D2 rectifying elements (diodes)
Ct capacitance
3' alternative clipping circuit
Dcl clipping diode
Gbb gate bondbar (gate bondpad)
Dbb drain bondbar (drain bondpad)
29 field oxide (LOCOS)
32 silicide regions (connecting poly diodes in series)
60 scratch protection layer ($Si_3N_4$-layer)
M1 first metal layer
M2 second metal layer
PDL poly diode layer
d dielectric layers
p p-type doped region
n n-type doped region
Crv1 first curve (without protection circuit)
Crv2 second curve (with protection circuit)
TLPC TLP current
TLPV TLP voltage

DETAILED DESCRIPTION OF EMBODIMENTS

In this description an RF-LDMOS transistor with an ruggedness protection is proposed. In specific embodiments this protection is integrated on the same substrate. With the use of ruggedness protection circuit the voltage spikes, which occur if power is reflected, can be clipped. This provides protection for the RF-LDMOS. The protection is preferably integrated directly on the drain of the RF-LDMOS. If the protection is provided as an external component, the phase difference between the actual drain of the LDMOS and the ruggedness protection circuit may make the protection less effective. Integrating the protection on the LDMOS die therefore improves the RF performance.

The advantages of the ruggedness protection of the invention are:

The parasitic capacitance of the ruggedness protection is small. A large capacitance results in large losses in the capacitance, which will decrease the efficiency of the LDMOS transistor; and The ruggedness protection has a high current capability. During a ruggedness event a high current may flow to prevent the voltage to increase further. These aspect will be elucidated in the description of the embodiments hereinafter.

To facilitate the understanding of the scope of the invention and its variations, a few terms are defined hereinafter.

Throughout this description the term "interconnect layer" should be considered as synonym to "metallization layer" or "metal layer". Both terms are used interchangeably and have to be interpreted as the layer comprising conductors, the insulating layer in which the conductors are embedded, and any vias (=contacts) to underlying layers. These terms are well-known to the person skilled in the art of semiconductor technology.

In this description the term "RF power amplifier" refers to a circuit used to convert a low-power radio-frequency signal into a larger signal of significant power, typically for driving the antenna of a transmitter FIG. 1 shows a schematic cross-sectional view of an RF-LDMOS transistor as known from the prior art. The RF-LDMOS transistor 1 is integrated on a P-type substrate 10. On the substrate 10 there is provided an P-type epitaxial (EPI) layer 20. In the P-type epitaxial layer 20 an P-type sinker layer 21 is formed for establishing an electrical contact with the P-type substrate 10 of which the back-side forms the source contact of the RF-LDMOS transistor. Adjacent the P-type sinker layer 21 there is provided a P-well region 22, which comprises the channel region of the RF-LDMOS transistor. The EP-layer 20 further comprises an N-type drain extension layer 23 (weakly doped for forming a high resistance), a heavily-doped N-type source region 24, and a heavily-doped N-type drain region 25, wherein the drain extension layer 23 is situated in between the channel region and the drain region 25. A silicide layer 26 is provided on the P-type sinker layer 21 and on part of the N-type source region 24. This silicide layer 26 effectively connects the source region 24 to the substrate 10. On top of the silicide layer 26 there is provided a source line 40 for connecting a plurality of source regions (not shown) together. Above the drain region 25 there is provided a drain line 50 and a connecting stack 45 for connecting the drain line 50 to the drain region 25. On the channel region there is further provided a dielectric layer/gate dielectric 27 (for example comprising silicon oxide) extending form an end of the silicide layer 26 to the connecting stack 45 for the drain line 50. On top of the gate dielectric 27 there is provided a gate 30 being capacitively coupled to the channel region in between the source region 24 and the drain extension layer 23. Over the gate 30 and the gate dielectric layer 27 there is provided a further dielectric layer 28. On top of the further dielectric layer 28 there is provided a shield 35. The shield 35 serves as an electrical shield between the drain line 50 and the gate 30. It must be noted that FIG. 1 discloses an N-type RF-LDMOS transistor 1. A P-type RF-LDMOS transistor is obtained if the respective conductivity types of the source region 23, channel region, drain extension region 23, and drain region 25 are reversed. However, such P-type RF-LDMOS transistor has a lower performance (when the size is kept constant), due to the lower mobility of the majority carriers (holes) in the channel region.

In the RF-LDMOS transistor of FIG. 1 there is inherently present an NPN parasitic bipolar transistor 100, indicated by the rectangle. It is important to note that this NPN parasitic bipolar transistor 100 has a low gain. Nevertheless, it may happen that this bipolar transistor is switched 100 during operation, in particular in case of reflections at the output of the RF-LDMOS transistor due to impedance mismatch. During such reflections the voltage on the drain may get too high, switching on the bipolar transistor 100, which then directly destroys the device 1.

Figure 2:
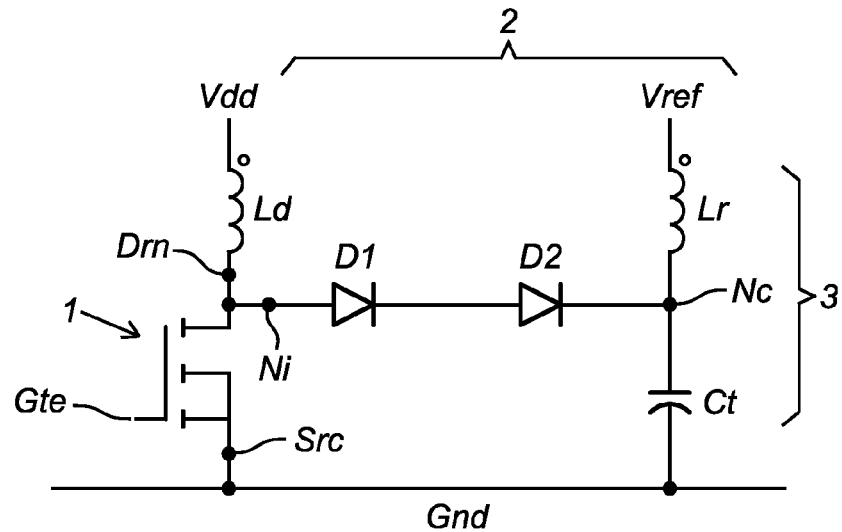
FIG. 2 shows an equivalent circuit diagram of an electronic device in accordance with a first embodiment of the invention.

FIG. 2 shows an equivalent circuit diagram of an electronic device in accordance with a first embodiment of the invention. On the left side of FIG. 2 there is shown the RF-LDMOS transistor 1 which is connected, via a drain terminal bondwire Ld (with an inductance), with its drain terminal Drn to a drain lead connected to a power supply voltage Vdd. This supply voltage Vdd is typically within the range of 28V to 50V. An LDMOS device optimized for 28V will have slightly other dimensions then the 50V variant. The RF-LDMOS transistor also comprises a gate terminal Gte which is typically connected to a gate lead via a further bondwire (not shown). The source terminal Src of the LDMOS transistor 1 is connected to the ground voltage (potential) Gnd. As already mentioned the source terminal of the RF-LDMOS is typically at the backside of a substrate. Typically, the substrate onto which the RF-LDMOS is manufactured is directly provided on and in electrical contact with a source lead.

The electronic device further comprises a protection circuit 2. The protection circuit 2 comprises a clipping circuit 3. The protection circuit 2 has an input terminal Ni which is coupled to the drain terminal Drn of the LDMOS transistor 1. The input terminal Ni is connected to a series connected of two diodes D1, D2, which together form an implementation of a rectifying element. The rectifying element is connected such that its anode side is coupled to the drain terminal Drn. The cathode side of the rectifying element is coupled to a clipping node Nc. The clipping node Nc forms part of the clipping circuit 3. The clipping circuit comprises a reference terminal bondwire Lr (with an inductance) coupled between the clipping node Nc and a reference voltage terminal being at a reference voltage Vref. The clipping circuit 3 further comprises a capacitance Ct coupled between the clipping node Nc and a further reference voltage terminal being at ground voltage Gnd.

As is shown in FIG. 2, the diodes D1, D2 are provided directly on the drain terminal Drn of the LDMOS transistor 1. For this purpose, a poly diode is advantageous. These diodes can be integrated on top of the locos oxide, which results in a low capacitance to ground. The breakdown voltage of the diode should be above the reference voltage which is Vref applied via the reference terminal bondwire Lr. If the diode has a breakdown voltage below this reference voltage, a series of diodes can be used as illustrated in FIG. 2.

In this embodiment the diode(s) D1, D2 are connected to an integrated grounded capacitance Ct, which is also connected to an external lead to supply the reference voltage Vref.

The value of the reference voltage Vref should be so low as possible, so the protection circuit 2 switches on as early as possible in case of a ruggedness event. However, if the reference voltage Vref is set too low, the RF-performance will degrade. So, it is advantageous to use a value larger than two times the supply voltage Vdd. During normal RF operation, the voltage across capacitance Ct will be substantially equal to the reference voltage Vref. The voltage at the drain terminal Drn of the RF-LDMOS transistor will be below this level. The poly diodes D1, D2 will be in reverse, and no significant current will flow through them.

During a ruggedness event, the voltage direct on the drain terminal, can get higher than the reference voltage Vref. Now, the diodes D1, D2 are forward biased and a (large) current flows through the diodes D1, D2. This current may charge up the capacitance Ct. After the ruggedness event, the capacitance Ct will discharge to the reference voltage Vref, while delivering power to the voltage source which is used to generate Vref.

A key aspect of the invention is that the (poly) diodes only have to cope with the large ruggedness current in forward-bias mode. This gives a relative low dissipation in to diodes D1, D2, because of the low voltage drop across the diodes. Consequence is that the (poly) diodes can be relative small. This relative small size of the diodes is giving a small capacitance of the diode and so only a small degradation of RF-behavior.

Figure 3:
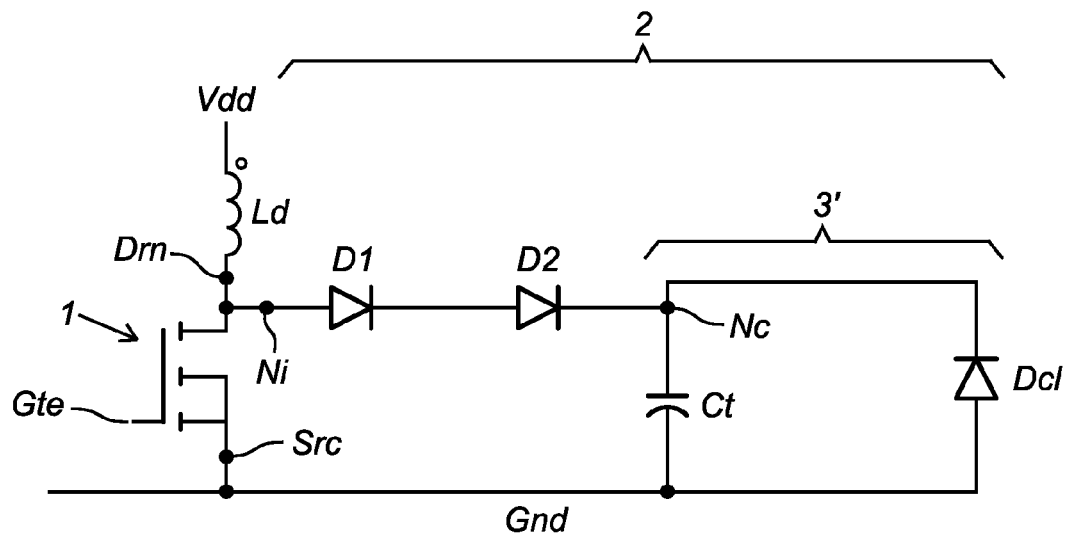
FIG. 3 shows an equivalent circuit diagram of an electronic device in accordance with a second embodiment of the invention.

FIG. 3 shows an equivalent circuit diagram of an electronic device in accordance with a second embodiment of the invention. This embodiment will be discussed in as far as it differs from FIG. 2. Sometimes, it may be inconvenient to feed the extra reference voltage Vref via additional bondwires to the chip. In the embodiment of FIG. 3 the reference voltage is created on the die itself. The main difference between FIG. 3 and FIG. 2 is that in FIG. 3 there is an alternative clipping circuit 3'. The alternative clipping circuit 3' comprises the capacitance Ct and a clipping diode Dcl connected in parallel with the capacitance Ct, wherein the anode side of the clipping diode Dcl is connected to the ground voltage (further reference voltage terminal), i.e. in normal operation the clipping diode Dcl is reverse-biased.

A clipping diode Dcl with a breakdown voltage equal to the earlier mentioned reference voltage Vref in FIG. 2, is integrated near to capacitance Ct. This clipping diode Dcl must be able to dissipate the high power associated with a ruggedness event. Therefore, the thermal resistance of the diode should be low and, preferably, a diode that is integrated in the (silicon) substrate should be used. Furthermore, the diode Dcl must be relative large.

The large clipping diode Dcl has a large capacitance to ground, however since the capacitance of the (poly) diodes D1, D2 is low, and this doesn't load the drain of the RF-LDMOS. It must be noted that even though a separate capacitance Ct has been drawn in FIG. 3, this capacitance may also be (at least) partially formed by the parasitic capacitance of the clipping diode Dcl.

At switch-on of the circuit, the RF-signal at the drain Drn will charge up the capacitance Ct. After this charging up, the behavior of this embodiment is the same as for embodiment of FIG. 2. However, in this case the energy associated with the ruggedness event cannot be delivered back to the power supply. Instead of that, the energy is dissipated in the clipping diode Dcl.

Figure 4:
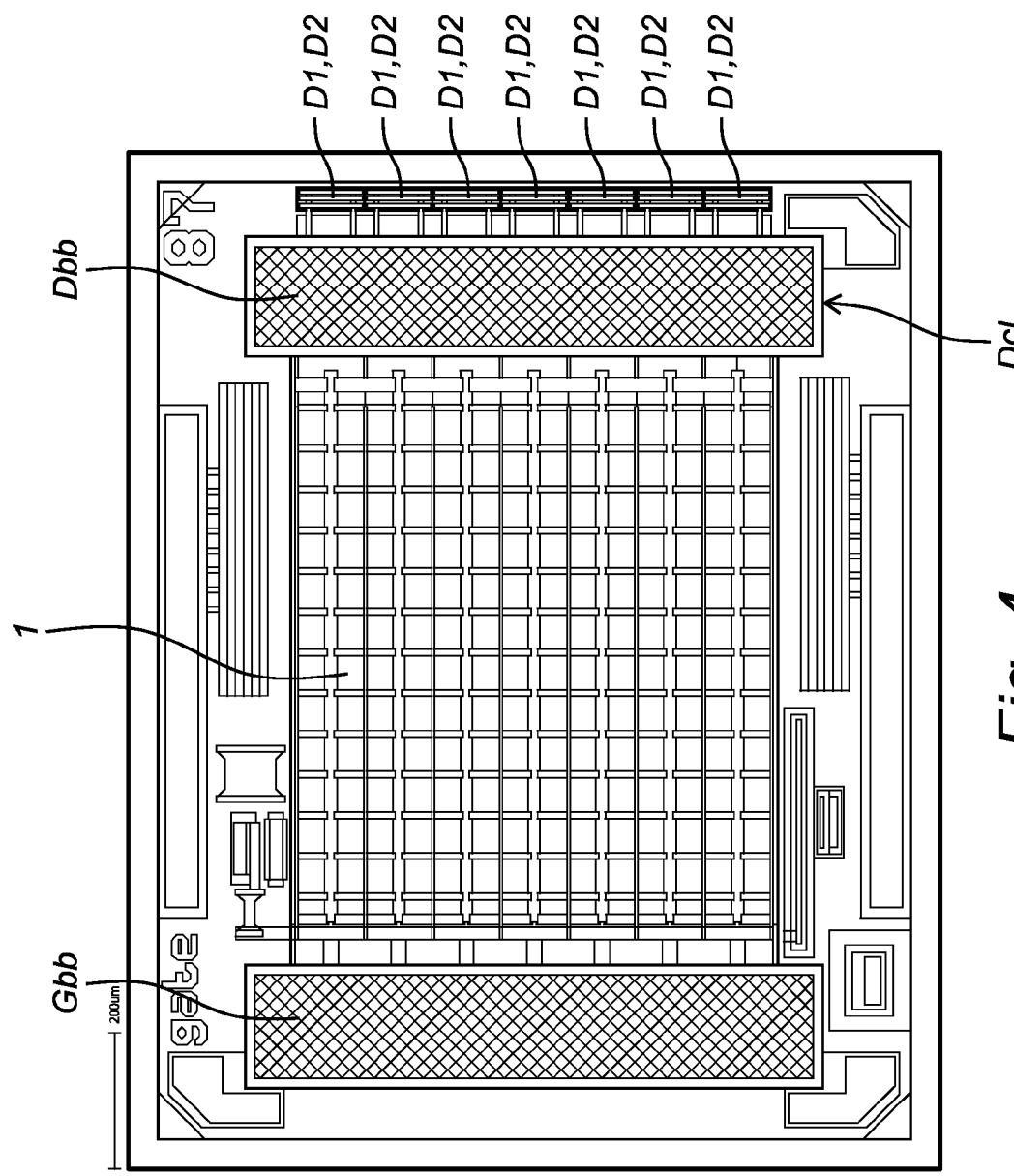
FIG. 4 shows a layout of the electronic device of FIG. 3.

FIG. 4 shows a layout of the electronic device of FIG. 3. This figure merely serves to illustrate the feasibility of the invention. By no means, the invention is limited to this specific layout. There are literally thousands of layout implementations possible. In the layout in FIG. 4 there is visible a gate bondbar Gbb (a bondbar is a bondpad suitable for bonding a plurality of bond wires) and a drain bondbar Dbb, wherein between the LDMOS transistor 1 is laid out (including its drain and gate fingers). In this embodiment the rectifying element (in the form of a series connection of two diodes D1, D2) is laid out at least partially underneath the drain bondbar Dbb, which saves space. The clipping diode Dcl is also laid out underneath the drain bondbar Dbb, but then in the substrate (a junction formed by a diffusion in the substrate).

Figure 5:
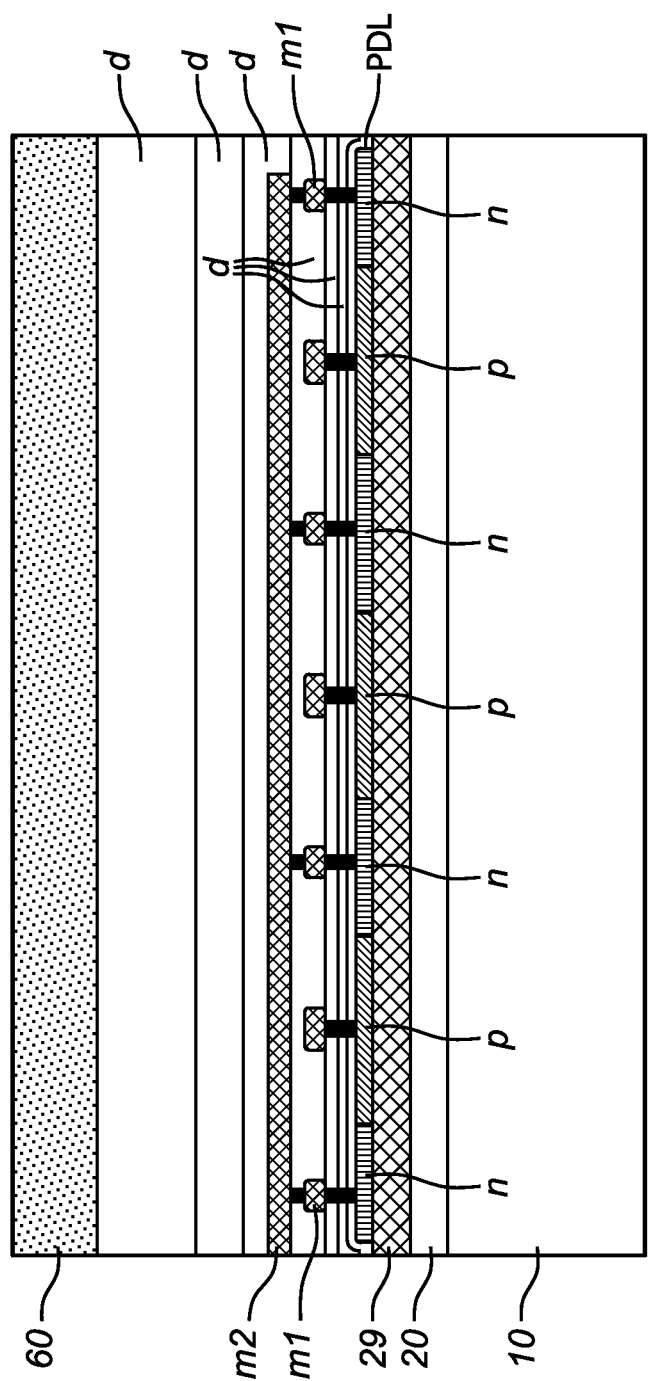
FIG. 5 shows a cross-sectional view of the electronic device in accordance with another embodiment of the invention, having a single diode as rectifying element.

FIG. 5 shows a cross-sectional view of the electronic device in accordance with another embodiment of the invention, having a single diode as rectifying element. Reference is also made to the description of FIG. 1, including the reference numbers used in that figure. In FIG. 5 there is shown the substrate 10 provided with the N-type EPI-layer 20 on top of it. On the EPI-layer 20 there is provided a field oxide layer 29 (this may be a LOCOS layer, but alternatively, this could be an shallow-trench-isolation (STI) layer. On top of the field oxide layer 29 there is provided the poly diode layer PDL which comprises P-type doped regions p and N-type doped regions n, alternatingly. All P-type doped regions p are connected together via a first metal layer M1 (connected to the diodes via respective contacts). All N-type doped regions n are connected together via a second metal layer M2 (connected to the diodes via respective vias, first metal layer parts, and contacts). In between the respective poly diode layer PDL and the metal layers M1, M2 there is provided respective dielectric layers d. On top of the layer stack there is provided a scratch protection layer 60 (typically comprising silicon nitride ($Si_3N_4$)).

Figure 6:
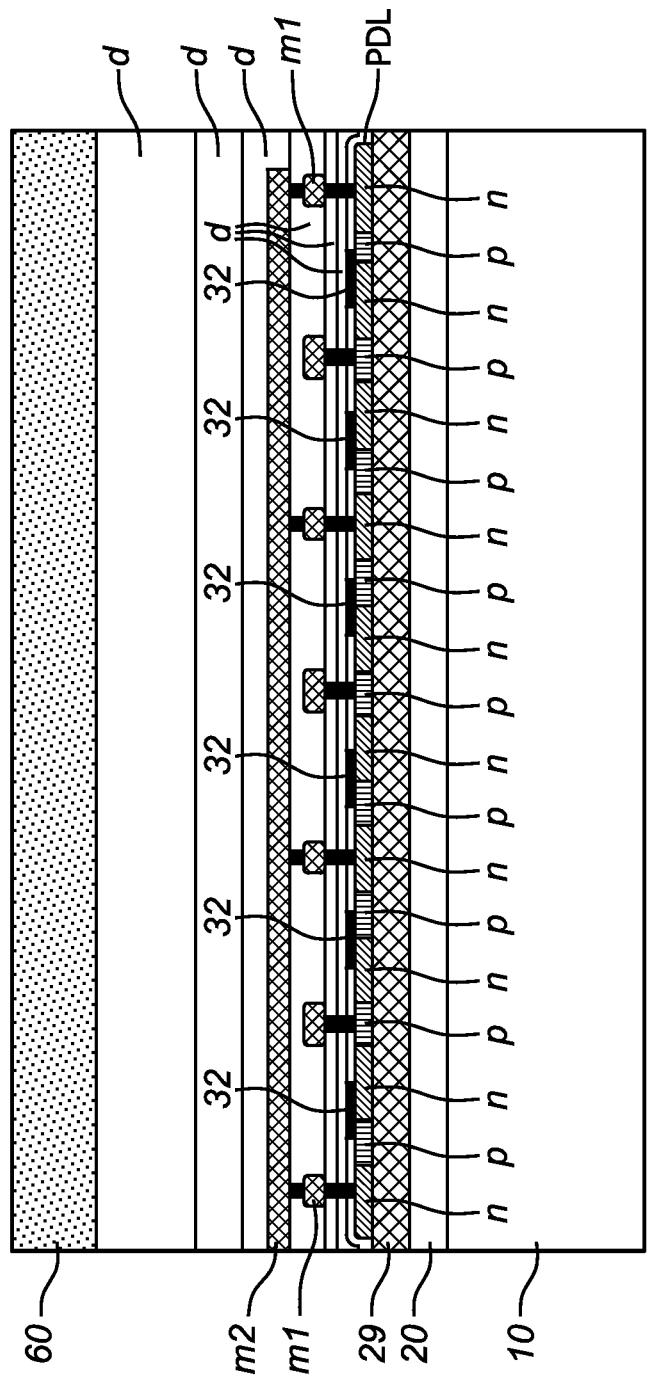
FIG. 6 shows a cross-sectional view of the electronic device in accordance with another embodiment of the invention, having a series of two diodes as rectifying element.

FIG. 6 shows a cross-sectional view of the electronic device in accordance with another embodiment of the invention, having a series of two diodes as rectifying element. The main difference between FIGS. 5 and 6. Is that in FIG. 6 the dopants in the poly diode layer PDL are formed such that a NPNP region forming three PN-junctions in between two neighboring connections. However, the respective middle junctions are short circuited by means of respective silicide regions 32, which means that two PN-junctions are effectively connected in series.

Figure 7:
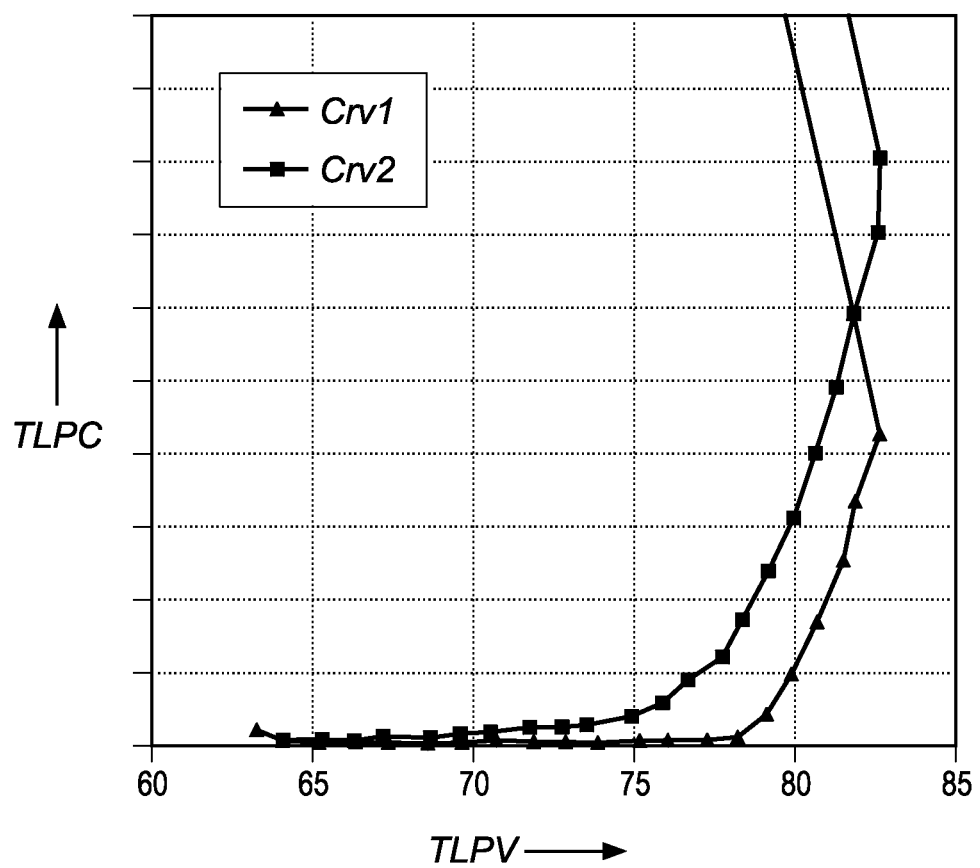
FIG. 7 shows the results of a TLP evaluation of the embodiment of FIG. 4.

FIG. 7 shows the results of a TLP evaluation of the embodiment of FIG. 4. Ruggedness can be evaluated using a TLP (Transmission Line Pulse) system. TLP tests and systems as such are well-known to the person skilled in the art. A TLP test is often used for ESD characterization, but can also be used for ruggedness evaluation. FIG. 7 shows two curves wherein the TLP current TLPC is plotted against the TLP voltage TLPV. The first curve Crv1 represents an RF-LDMOS transistor without a protection circuit 2, and the second curve Crv2 represents an RF-LDMOS transistor with a protection circuit as presented in FIG. 3. It can be clearly observed from the curves that due to the protection circuit of the invention the current capability significantly increases.

The term "substrate" may denote any suitable material, such as a semiconductor, glass, plastic, etc. According to an exemplary embodiment, the term "substrate" may be used to define generally the elements for layers that underlie and/or overlie a layer or a portion of interest. Also, the substrate may be any other base on which a layer is formed, for example a semiconductor wafer such as a silicon wafer or silicon chip. A semiconductor substrate may comprise a material of the group comprising: a group IV semiconductor (such as silicon or germanium), and a group III-group V compound semiconductor (such as gallium arsenide).

The term "semiconductor device" may denote a transistor or a circuit comprising a plurality of transistors and interconnections. The transistor may be a field effect transistor for example.

The term "field effect transistor" (FET) may denote a transistor in which an output current (source-drain current) may be controlled by the voltage applied to a gate. Such FET structure may be an MOSFET. The semiconductor device can be any integrated circuit and may comprise logic circuitry, photo sensitive cells, memory cells, and the like. The material of the semiconductor structure may be silicon, germanium, or any other semiconductor material.

As the invention is related towards technology rather than circuits the following description of the drawings does not elaborate in much detail on the operation of CCD and CMOS imagers. Such knowledge is considered to be known to the person skilled in the art.

It should be noted that the above-mentioned embodiments illustrate rather than limit the invention, and that those skilled in the art will be able to design many alternative embodiments.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed:

1. An electronic device comprising an RF-LDMOS transistor and a protection circuit for the RF-LDMOS transistor, the protection circuit comprising:
   an input terminal coupled to a drain terminal of the RF-LDMOS transistor;
   a clipping node,
   a rectifying element connected with its anode terminal to the input terminal and with its cathode terminal to the clipping node,
   a clipping circuit coupled to the clipping node for substantially keeping the voltage on the clipping node below a predefined reference voltage for keeping the rectifying element inversely biased during normal mode of operation of the RF-LDMOS transistor, wherein the predefined reference voltage is designed to be larger than the operation voltage on the drain terminal and lower than a trigger voltage of a parasitic bipolar transistor that is inherently present in the RF-LDMOS transistor,
   a capacitance coupled between the clipping node and a further reference voltage terminal; and
   wherein the clipping circuit comprises a further rectifying element connected with its cathode terminal to the clipping node and with its anode terminal to the further reference voltage terminal.

2. The electronic device as claimed in claim 1, wherein the clipping circuit comprises: i) a reference voltage terminal for being coupled to the predefined reference voltage, and ii) a connector coupled between the clipping node and the reference voltage terminal.

3. The electronic device as claimed in claim 2, wherein the connector is formed by a respective bondwire coupled between the clipping node and the reference voltage terminal.

4. The electronic device as claimed in claim 1, wherein the further rectifying element comprises a diode and the capacitance is formed by the parasitic capacitance of the diode.

5. The electronic device as claimed in claim 2, wherein the further reference voltage is the voltage of the source terminal of RF-LDMOS transistor.

6. The electronic device as claimed in claim 1, wherein the rectifying element comprises a single diode.

7. The electronic device as claimed in claim 1, wherein the rectifying element comprises a plurality of diodes connected in series.

8. The electronic device as claimed in claim 1, wherein the further rectifying element comprises a single diode.

9. The electronic device as claimed in claim 1, wherein the further rectifying element comprises a plurality of diodes connected in series.

10. The electronic device as claimed in claim 1, wherein the RF-LDMOS transistor and the protection circuit are integrated on a single substrate.

11. The electronic device as claimed in claim 10, wherein the RF-LDMOS transistor comprises a drain bondpad in an upper interconnect layer forming the drain terminal, wherein at least part of the clipping circuit is substantially laid out underneath the drain bondpad.

12. A power amplifier comprising the electronic device according to claim 1.

13. An integrated multi-stage power amplifier module comprising one or more electronic devices according to claim 1.

14. A cellular base station comprising the electronic device according to claim 1.

* * * * *